(12) United States Patent
Hong et al.

(10) Patent No.: US 11,475,966 B2
(45) Date of Patent: Oct. 18, 2022

(54) MEMORY DEVICE AND METHOD OF OPERATING THE SAME

(71) Applicant: SK hynix Inc., Icheon-si (KR)

(72) Inventors: Yong Hwan Hong, Icheon-si (KR); Byung Ryul Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/185,508

(22) Filed: Feb. 25, 2021

(65) Prior Publication Data

US 2022/0068409 A1    Mar. 3, 2022

(30) Foreign Application Priority Data

Aug. 25, 2020 (KR) .......................... 10-2020-0107379

(51) Int. Cl.
| | |
|---|---|
| G11C 16/10 | (2006.01) |
| G11C 16/34 | (2006.01) |
| G11C 16/04 | (2006.01) |
| G11C 16/26 | (2006.01) |
| G11C 16/30 | (2006.01) |
| G11C 16/16 | (2006.01) |

(52) U.S. Cl.
CPC ...... *G11C 16/3459* (2013.01); *G11C 16/0433* (2013.01); *G11C 16/16* (2013.01); *G11C 16/26* (2013.01); *G11C 16/30* (2013.01); *G11C 16/3404* (2013.01)

(58) Field of Classification Search
CPC . G11C 16/3459; G11C 16/0433; G11C 16/16; G11C 16/26; G11C 16/30; G11C 16/3404
See application file for complete search history.

(56) References Cited

U.S. PATENT DOCUMENTS

| | | | | |
|---|---|---|---|---|
| 2015/0179235 A1* | 6/2015 | Nam | ................. | G11C 16/0483 365/218 |
| 2017/0169892 A1* | 6/2017 | Joo | ..................... | G11C 16/0466 |

FOREIGN PATENT DOCUMENTS

| | | |
|---|---|---|
| KR | 1020160107606 A | 9/2016 |
| KR | 1020190050610 A | 5/2019 |

\* cited by examiner

*Primary Examiner* — Xiaochun L Chen
(74) *Attorney, Agent, or Firm* — William Park & Associates Ltd.

(57) ABSTRACT

A memory device according to an embodiment includes a plurality of cell strings each including a select transistor and memory cells connected in series, a peripheral circuit configured to apply a verify voltage to the select transistor and perform an internal operation on the memory cells, and control logic configured to control the peripheral circuit to apply an operation voltage for the internal operation. The control logic includes a bad string management component configured to verify threshold voltages of the select transistor and control the peripheral circuit to perform the internal operation on a cell string including a select transistor passed in verification according to a verify result of the select transistor.

16 Claims, 13 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0107379, filed on Aug. 25, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device such as a computer or a smartphone. A storage device may include a memory device in which data is stored and a memory controller for controlling the memory device. The memory device may be classified as a volatile memory device or a non-volatile memory device.

A volatile memory device is a device that stores data only when power is supplied and loses the stored data when the power supply is interrupted. Volatile memory devices include, for example, static random access memory (SRAM), dynamic random access memory (DRAM), and the like.

A non-volatile memory device is a device that does not lose data in the absence of power. Non-volatile memory devices include, for example, read only memory (ROM), programmable ROM (PROM), electrically programmable ROM (EPROM), electrically erasable and programmable ROM (EEPROM), flash memory, and the like.

In order to improve the degree of integration for memory devices, three-dimensional structures are being studied. A three-dimensional memory device has a structural characteristic different from existing two-dimensional memory devices. Due to the structural difference between three-dimensional memory devices and two-dimensional memory devices, various driving methods for driving three-dimensional memory devices are also being studied.

SUMMARY

An embodiment of the present disclosure provides a memory device capable of processing only a corresponding string as a bad string when a distribution of select transistors is abnormally formed, and a method of operating the same.

A memory device according to an embodiment of the present disclosure may include a plurality of cell strings each including a select transistor and memory cells connected in series, a peripheral circuit configured to apply a verify voltage to the select transistor and perform an internal operation on the memory cells, and control logic configured to control the peripheral circuit to apply an operation voltage for the internal operation. The control logic may include a bad string management component configured to verify threshold voltages of the select transistor and control the peripheral circuit to perform the internal operation on a cell string including a select transistor passed in verification according to a verify result of the select transistor.

A method of operating a memory device according to an embodiment of the present disclosure may include verifying threshold voltages of a select transistor, storing status information according to a verify result for the threshold voltages of the select transistor, outputting a status signal including a first status signal indicating a pass status of the select transistor and a second status signal indicating a fail status of the select transistor according to the status information, and performing an internal operation in response to the status signal.

According to an embodiment of the present teachings, when a distribution of select transistors is abnormally formed, a memory device capable of processing only a corresponding string as a bad string, and a method of operating the same may be provided.

DETAILED DESCRIPTION

Specific structural or functional descriptions disclosed in the present specification or application serve to describe embodiments according to the concept of the present disclosure. Embodiments according to the concept of the present disclosure may be carried out in various forms and are not limited to the specific embodiments described in the present specification or application.

Hereinafter, embodiments of the present disclosure will be described in detail with reference to the accompanying drawings, so that those skilled in the art to which the present disclosure pertains may carry out the technical spirit of the present disclosure.

Figure 1:
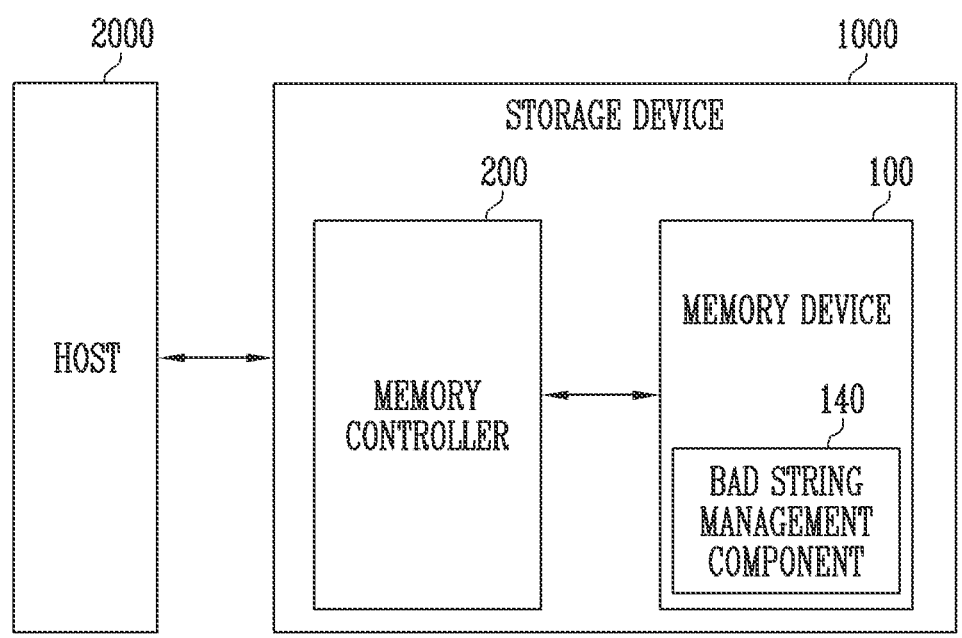
FIG. 1 is a block diagram illustrating a storage device according to an embodiment of the present disclosure.

FIG. 1 is a block diagram illustrating a storage device 1000 according to an embodiment of the present disclosure.

Referring to FIG. 1, the storage device 1000 may include a memory device 100 and a memory controller 200.

The storage device 1000 may be a device that stores data under the control of a host 2000 such as a cellular phone, a smartphone, an MP3 player, a laptop computer, a desktop computer, a game player, a display device, a tablet PC, or an in-vehicle infotainment system.

The storage device 1000 may be implemented as one of various types of storage devices according to a host interface that serves as a communication method for communicating with the host 2000. For example, the storage device 1000 may be implemented as any one of various types of storage devices, such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, or a memory stick.

The storage device 1000 may be implemented as any one of various types of packages. For example, the storage device 1000 may be implemented as any one of various types of package types, such as a package on package (POP), a system in package (SIP), a system on chip (SOC), a mufti-chip package (MCP), a chip on board (COB), a wafer-level fabricated package (WFP), and a wafer-level stack package (WSP).

The memory device 100 may store data or use the stored data. Specifically, the memory device 100 may operate in response to the control of the memory controller 200. In addition, the memory device 100 may include a plurality of memory dies, and each of the plurality of memory dies may include a memory cell array including a plurality of memory cells storing data.

Each of the memory cells may be configured as a single-level cell (SLC) that stores one data bit, a multi-level cell (MLC) that stores two data bits, a triple-level cell (TLC) that stores three data bits, or a quad-level cell (QLC) that stores four data bits.

The memory cell array may include a plurality of memory blocks. Each memory block may include a plurality of memory cells, and one memory block may include a plurality of pages. Here, a page may be one unit for storing data in the memory device 100 or reading the data stored in the memory device 100.

The memory device 100 may be implemented using double data rate synchronous dynamic random access memory (DDR SDRAM), low power double data rate4 (LPDDR4) SDRAM, graphics double data rate (DDDR) SDRAM, low power DDR (LPDDR), Rambus dynamic random access memory (RDRAM), NAND flash memory, vertical NAND flash memory, NOR flash memory, resistive random access memory (RRAM), phase-change memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 uses NAND flash memory.

The memory device 100 may receive a command and an address from the memory controller 200. The memory device 100 may be configured to access a region selected by the received address among the memory cell array. Accessing the selected region may mean performing an operation corresponding to the received command on the selected region. For example, the memory device 100 may perform a write operation (a program operation), a read operation, and an erase operation. Here, the program operation may be an operation in which the memory device 100 writes data to the region selected by the address. The read operation may mean an operation in which the memory device 100 reads data from the region selected by the address. The erase operation may mean an operation in which the memory device 100 erases data stored in the region selected by the address.

Each of the plurality of memory dies included in the memory device 100 may include at least one memory cell array. In addition, the plurality of memory dies may be controlled through a die interleaving operation, a channel interleaving operation, a way interleaving operation, or a plane interleaving operation.

In an embodiment of the present disclosure, the memory device 100 may include a bad string management component 140. The bad string management component 140 may store status information of a select transistor, which is a result of a verify operation on the select transistors, and may output a status signal according to the status information of the select transistor. In addition, the bad string management component 140 may control a peripheral circuit to perform an internal operation on a cell string including a select transistor that passed verification and to not perform the internal operation on a cell string including a select transistor that failed verification according to the verify result of the select transistor. The internal operation performed by the peripheral circuit may be a read operation, an erase operation, or a program operation.

The memory controller 200 may execute firmware (FW) when power is applied to the storage device 1000. The firmware (FW) may include a host interface layer (HIL) that receives a request input from the host 2000 or outputs a response to the host 2000, a flash translation layer (FTL) that manages an operation between an interface of the host 2000 and an interface of the memory device 100, and a flash interface layer (FIL) that provides a command to the memory device 100 or receives a response from the memory device 100.

The memory controller 200 may receive data and a logical address (LA) from the host 2000, and convert the LA into a physical address (PA) indicating an address of memory cells in which data included in the memory device 100 is to be stored. The LA may be a logical block address (LBA), and the PA may be a physical block address (PBA).

The memory controller 200 may control the memory device 100 to perform the program operation, the read operation, the erase operation, or the like according to the request of the host 2000. During the program operation, the memory controller 200 may provide a program command, the PBA, and data to the memory device 100. During the read operation, the memory controller 200 may provide a read command and the PBA to the memory device 100.

During the erase operation, the memory controller 200 may provide an erase command and the PBA to the memory device 100.

The memory controller 200 may control the memory device 100 to perform the program operation, the read operation, or the erase operation by itself independent of a request from the host 2000. For example, the memory controller 200 may control the memory device 100 to perform the program operation, the read operation, or the erase operation used to perform a background operation such as wear leveling, garbage collection, and read reclaim.

The host 2000 may communicate with the storage device 1000 using at least one of various communication protocols, such as a universal serial bus (USB), a serial AT attachment (SATA), a serial attached SCSI (SAS), a high speed intership (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
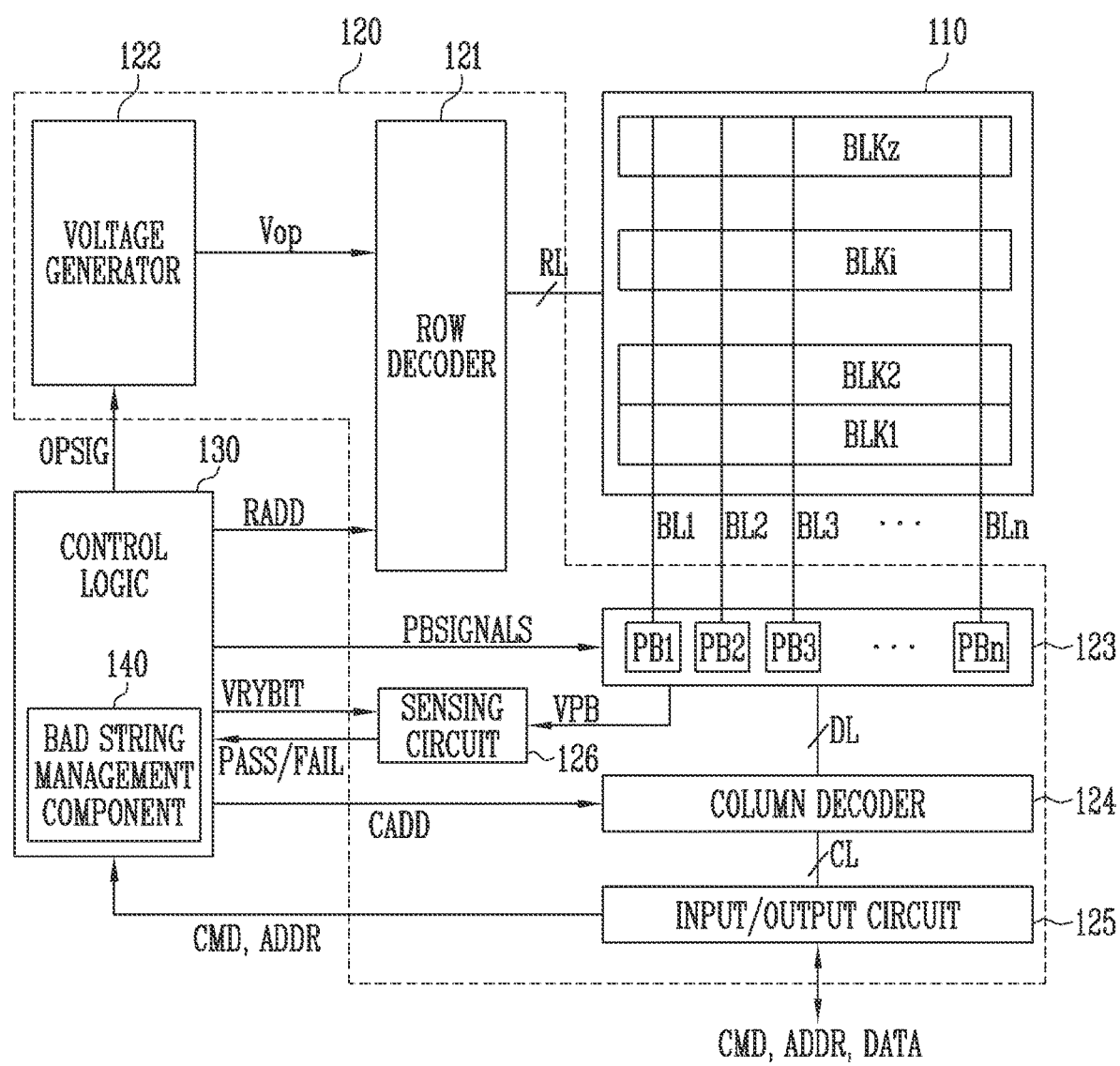
FIG. 2 is a block diagram illustrating a memory device according to an embodiment of the present disclosure.

FIG. 2 is a block diagram illustrating the memory device 100 according to an embodiment of the present disclosure.

Referring to FIG. 2, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz may be connected to a row decoder 121 through row lines RL. The plurality of memory blocks BLK1 to BLKz may be connected to a page buffer group 123 through bit lines BL1 to BLn. Each of the plurality of memory blocks BLK1 to BLKz may include a plurality of memory cells. As an embodiment, the plurality of memory cells may be non-volatile memory cells. Memory cells connected to the same word line may be defined as one page. Therefore, one memory block may include a plurality of pages. The row lines RL may include at least one source select line, a plurality of word lines, and at least one drain select line.

Each of the memory cells included in the memory cell array 110 may be configured as a single-level cell (SLC) that stores one data bit, a multi-level cell (MLC) that stores two data bits, a triple-level cell (TLC) that stores three data bits, or a quad-level cell (QLC) that stores four data bits.

The peripheral circuit 120 may be configured to perform the program operation, the read operation, or the erase operation on the selected region of the memory cell array 110 under control of the control logic 130. That is, the peripheral circuit 120 may drive the memory cell array 110 under the control of the control logic 130. For example, the peripheral circuit 120 may apply various operation voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, and an input/output circuit 125.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In addition, the row lines RL may further include a pipe select line.

The row decoder 121 may be configured to operate in response to the control of the control logic 130. The row decoder 121 may receive a row address RADD from the control logic 130. Specifically, the row decoder 121 may be configured to decode the row address RADD. The row decoder 121 may select at least one of the memory blocks BLK1 to BLKz according to a decoded address. In addition, the row decoder 121 may select at least one word line of the memory block to apply the voltages generated by the voltage generator 122 to at least one word line WL according to the decoded address.

For example, during the program operation, the row decoder 121 may apply a program voltage to a selected word line and apply a program pass voltage of a level lower than that of the program voltage to an unselected word line. During a program verify operation, the row decoder 121 may apply a verify voltage to the selected word line and a verify pass voltage of a level higher than that of the verify voltage to the unselected word line. During the read operation, the row decoder 121 may apply a read voltage to the selected word line and apply a read pass voltage of a level higher than that of the read voltage to the unselected word line.

In an embodiment, the erase operation of the memory cell array 110 may be performed in a memory block unit. During the erase operation, the row decoder 121 may select one memory block according to the decoded address, and the row decoder 121 may apply a ground voltage to word lines connected to the selected memory block.

The voltage generator 122 may operate in response to the control of the control logic 130. The voltage generator 122 may be configured to generate a plurality of voltages using an external power voltage supplied to the memory device 100. For example, the voltage generator 122 may generate the program voltage, the verify voltage, the pass voltage, the read voltage, the erase voltage, and the like in response to the control of the control logic 130. That is, the voltage generator 122 may generate various operation voltages Vop used for the program, read, and erase operations in response to an operation signal OPSIG.

As an embodiment, the voltage generator 122 may generate an internal power voltage by regulating the external power voltage. The internal power voltage generated by the voltage generator 122 may be used as an operation voltage of the memory cell array 110.

As an embodiment, the voltage generator 122 may generate a plurality of voltages using the external power voltage or the internal power voltage. For example, the voltage generator 122 may include a plurality of pumping capacitors that receive the internal power voltage, and may selectively activate the plurality of pumping capacitors to generate the plurality of voltages, in response to the control of the control logic 130. In addition, the generated voltages may be supplied to the memory cell array 110 by the row decoder 121.

The page buffer group 123 may include first to nth page buffers PB1 to PBn. The first to n-th page buffers PB1 to PBn may be connected to the memory cell array 110 through the first to n-th bit lines BL1 to BLn, respectively. In addition, the first to nth page buffers PB1 to PBn may operate in response to the control of the control logic 130. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or may sense a voltage or a current of the bit lines BL1 to BLn during the read or verify operation.

Specifically, during the program operation, when a program pulse is applied to the selected word line, the first to nth page buffers PB1 to PBn may transfer data DATA received through the input/output circuit 125 to the selected memory cell through the first to nth bit lines BL1 to BLn. The memory cells of the selected page may be programmed according to the transferred data DATA. Memory cells of a page selected according to the transferred data DATA may be programmed. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained.

During the program verify operation, the first to n-th page buffers PB1 to PBn may read page data from the selected memory cells through the first to n-th bit lines BL1 to BLn.

During the read operation, the first to nth page buffers PB1 to PBn may read the data DATA from the memory cells of the selected page through the first to n-th bit lines BL1 to BLn, and output the read data DATA to the input/output circuit 125 under control of the column decoder 124.

During the erase operation, the first to nth page buffers PB1 to PBn may float the first to n-th bit lines BL1 to BLn.

As an embodiment, the page buffer group 123 may store a result of the erase operation. Specifically, the control logic 130 may control the peripheral circuit 120 to sequentially perform the verify operation for the erase operation on cell strings included in the memory block. In addition, the control logic 130 may store a verify result for the erase operation in a page buffer connected to an individual bit line among the page buffer group 123.

The column decoder 124 may transfer data between the input/output circuit 125 and the page buffer group 123 in response to a column address CADD. For example, the column decoder 124 may exchange data with the first to nth page buffers PB1 to PBn through data lines DL, or may exchange data with the input/output circuit 125 through column lines CL.

The input/output circuit 125 may transfer the command CMD and the address ADDR received from the memory controller 200 to the control logic 130, or may exchange the data DATA with the column decoder 124.

A sensing circuit 126 may generate a reference current in response to a peg mission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may be implemented as hardware, software, or a combination of hardware and software. For example, the control logic 130 may be a control logic circuit operating in accordance with an algorithm and/or a processor executing control logic code. The control logic 130 may output the operation signal OPSIG, the row address RADD, the page buffer control signals PBSIGNALS, and the permission bit VRYBIT in response to the command CMD and the address ADDR to control the peripheral circuit 120. In addition, the control logic 130 may determine whether the verity operation for the internal operation is passed or failed in response to the pass signal PASS or the fail signal FAIL.

As an embodiment according to the present disclosure, the control logic 130 may store verify information including the pass signal PASS or the fail signal FAIL for the erase operation in the page buffer group 123. Specifically, the memory device may sequentially perform erase verification on all cell strings included in the memory block for each cell string, and store a result of the erase verification in the page buffer connected to an individual bit line. As an embodiment, the control logic 130 may count the number of failed memory cells based on the verify information on the erase operation, and may output a trigger signal to additionally apply the erase voltage when the number of failed memory cells exceeds a preset number.

As an embodiment, the control logic 130 may control the peripheral circuit 120 to verify threshold voltages of the select transistor and perform an internal operation on a cell string including a select transistor passed in verification according to a verify result of the select transistor. Specifically, during the erase operation, the control logic 130 may control the peripheral circuit 120 so that a block word line voltage is generated even though a failed select transistor is included in the memory block to be erased. In addition, during an erase voltage apply period of the erase operation, the peripheral circuit 120 may be controlled to generate a select line selection signal with respect to all cell strings included in the memory block and to apply the same voltage to the select line corresponding to all the cell strings.

The bad string management component 140 may store status information of the select transistor, which is a result of the verify operation on the select transistors, and may output a status signal according to the status information of the select transistors. In addition, the bad string management component 140 may control the peripheral circuit to perform the internal operation on the cell string including the select transistor that passed in the verification and to not perform the internal operation on the cell string including the select transistor that failed in the verification according to the verify result of the select transistor.

Figure 3:
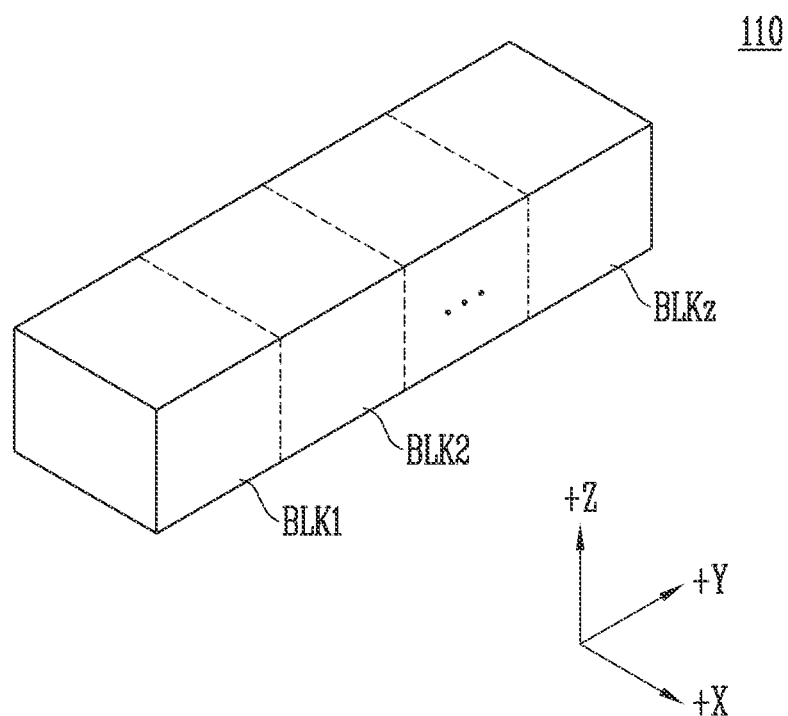
FIG. 3 is a diagram illustrating a memory cell array according to an embodiment of the present disclosure.

FIG. 3 is a diagram illustrating the memory cell array 110 according to an embodiment of the present disclosure.

Referring to FIG. 3, the memory cell array 110 may include a plurality of memory blocks BLK1 to BLKz. Each memory block may be formed in a three-dimensional structure, and each memory block may include a plurality of memory cells stacked on a substrate. The plurality of memory cells may be arranged along a +X direction, a +Y direction, and a +Z direction. The structure of each memory block is described in more detail with reference to FIGS. 4 and 5.

Figure 4:
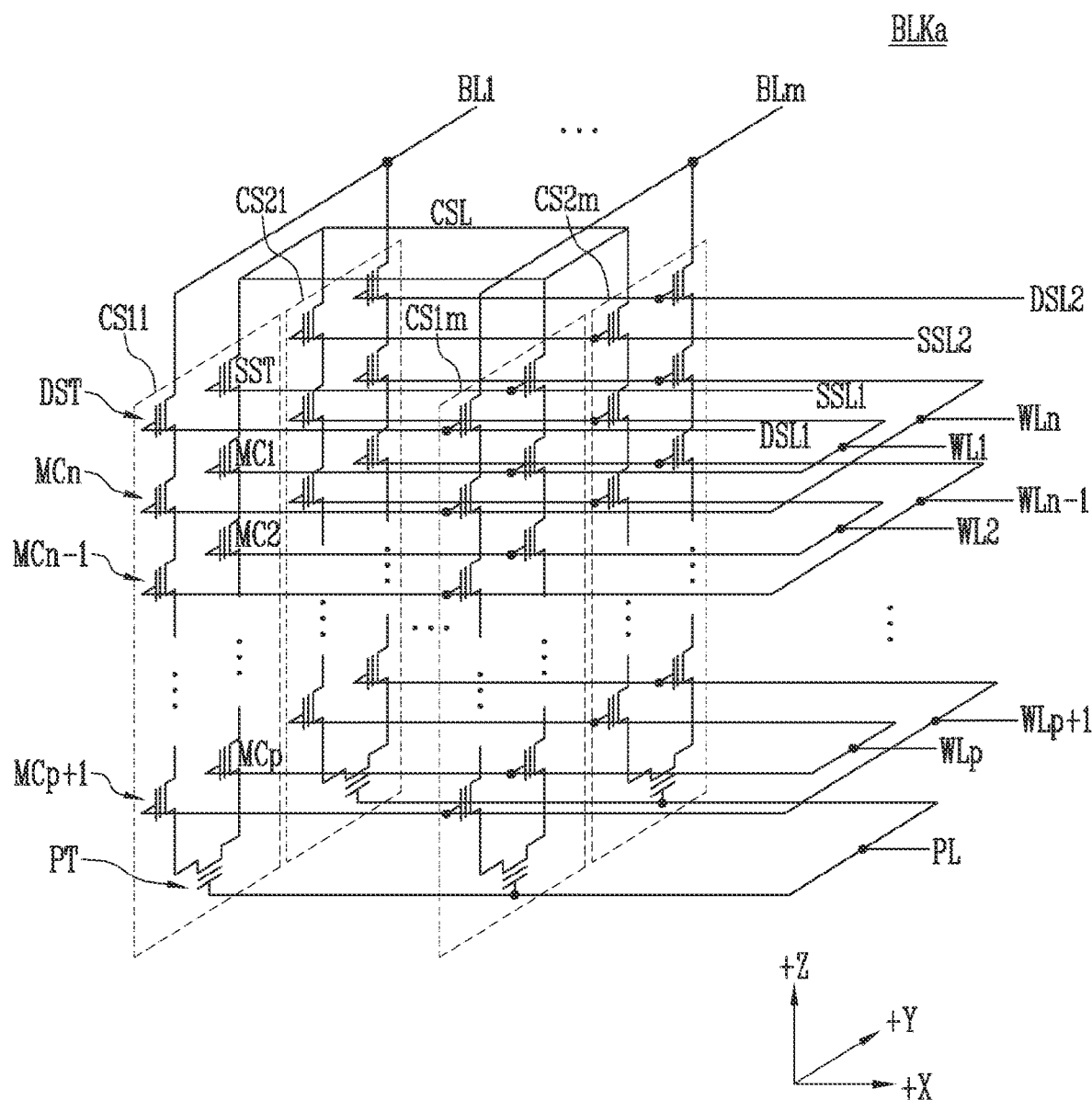
FIG. 4 is a diagram illustrating a memory block according to an embodiment of the present disclosure.

FIG. 4 is a diagram illustrating a memory block BLKa according to an embodiment of the present disclosure.

Referring to FIG. 4, the memory block BLKa may be any memory block among the memory blocks BLK1 to BLKz shown in FIG. 3. The memory block BLKa may include a plurality of cell strings CS11 to CS1$m$ and CS21 to CS2$m$. As an embodiment, each of the plurality of cell strings CS11 to CS1$m$ and CS21 to CS2$m$ may be formed in a 'U' shape. In the memory block BLKa, m cell strings may be arranged in a row direction (that is, the +X direction).

Meanwhile, in FIG. 4, two cell strings are arranged in a column direction (that is, the +Y direction), but this is for convenience of description, and in other embodiments, three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating layer, a charge storage layer, and a blocking insulating layer. As an embodiment, a pillar for providing a channel layer may be provided in each cell string. As an embodiment, a pillar for providing at least one of the channel layer, the tunneling insulating layer, the charge storage layer, and the blocking insulating layer may be provided in each cell string.

The source select transistor SST of each cell string may be connected between a common source line CSL and memory cells MC1 to MCp.

As an embodiment, source select transistors of cell strings arranged in the same row may be connected to a source select line extending in the row direction, and source select transistors of cell strings arranged in different rows may be connected to different source select lines. Referring to FIG. 4, source select transistors of cell strings CS11 to CS1m of a first row are connected to a first source select line SSL1. Source select transistors of cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a −Z direction, and may be connected between the source select transistor SST and the pipe transistor PT in series. The (p+1)-th to nth memory cells MCp+1 to MCn may be sequentially arranged in the +Z direction, and may be connected between the pipe transistor PT and the drain select transistor DST in series. The first to p-th memory cells MC1 to MCp and the (p+1)-th to n-th memory cells MCp+1 to MCn may be connected through the pipe transistor PT. Gates of the first to nth memory cells MC1 to MCn of each cell string may be connected to first to nth word lines WL1 to WLn, respectively.

A gate of the pipe transistor PT of each cell string may be connected to a pipe line PL.

The drain select transistor DST of each cell string is connected between a corresponding bit line and the memory cells MCp+1 to MCn. Cell strings arranged in the row direction may be connected to the drain select line extending in the row direction. Drain select transistors of the cell strings CS11 to CS1m of the first row may be connected to a first drain select line DSL1. Drain select transistors of the cell strings CS21 to CS2m of the second row may be connected to a second drain select line DSL2.

Cell strings arranged in the column direction may be connected to bit lines extending in the column direction. Referring to FIG. 4, the cell strings CS11 and CS21 of a first column are connected to the first bit line BL1. The cell strings CS1m and CS2m of an m-th column may be connected to the m-th bit line BLm.

Memory cells connected to the same word line within the cell strings arranged in the row direction may be configured as one page. For example, the memory cells connected to the first word line WL1 among the cell strings CS11 to CS1m of the first row may represent one page. The memory cells connected to the first word line WL1 among the cell strings CS21 to CS2m of the second row may represent another page. The cell strings arranged in one row direction may be selected by selecting one of the drain select lines DSL1 and DSL2. In addition, one page among the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

As an embodiment, at least one or more of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As more dummy memory cells are provided, reliability of an operation for the memory block BLKa may be improved, but a size of the memory block BLKa may increase. As less memory cells are provided, the size of the memory block BLKa may decrease, but the reliability of the operation for the memory block BLKa may be reduced.

In order to efficiently control at least one or more dummy memory cells, each of the dummy memory cells may have a required threshold voltage. Before or after an erase operation on the memory block BLKa, program operations on all or some of the dummy memory cells may be performed. When the erase operation is performed after the program operation is performed, the dummy memory cells may have the required threshold voltage by controlling a voltage applied to dummy word lines connected to the respective dummy memory cells.

Figure 5:
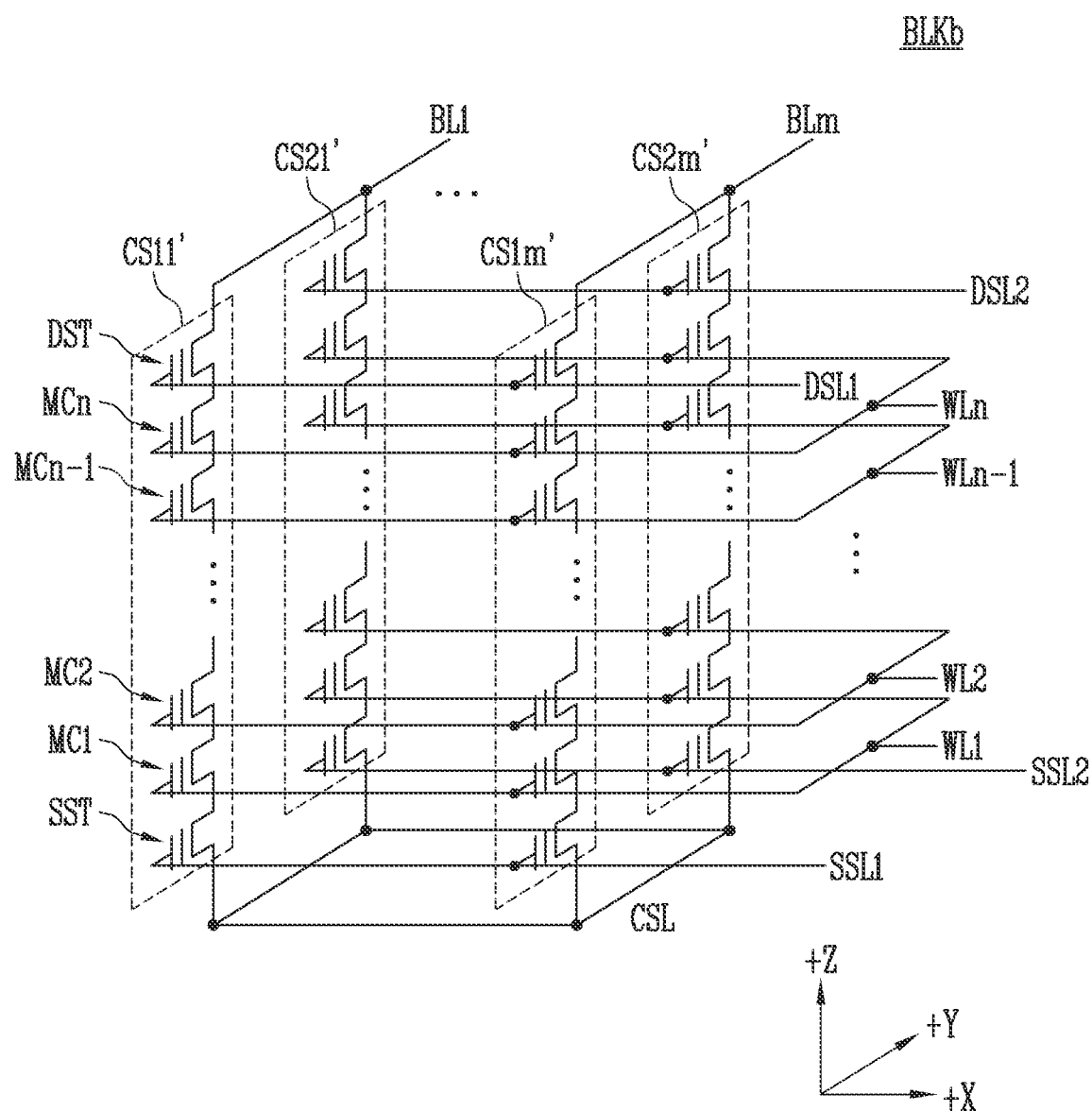
FIG. 5 is a diagram illustrating the memory block according to an embodiment of the present disclosure.

FIG. 5 is a diagram illustrating a memory block BLKb according to an embodiment of the present disclosure.

Referring to FIG. 5, the memory block BLKb represents another embodiment of a memory block among the memory blocks BLK1 to BLKz shown in FIG. 3. The memory block BLKb may include a plurality of cell strings CS11' to CS1m' and CS21' to CS2m'. Each of the plurality of cell strings CS11' to CS1m' and CS21' to CS2m' may extend along the +Z direction. Each of the plurality of cell strings CS11' to CS1m' and CS21' to CS2m' may include at least one source select transistor SST, first to n-th memory cells MC1 to MCn, and at least one drain select transistor DST, which are stacked on a substrate (not shown) under the memory block BLK1'.

The source select transistor SST of each cell string may be connected between the common source line CSL and the memory cells MC1 to MCn, Source select transistors of cell strings arranged in the same row may be connected to the same source select line. Source select transistors of cell strings CS11' to CS1m' arranged in the first row may be connected to the first source select line SSL1. Source select transistors of the cell strings CS21' to CS2m' arranged in the second row may be connected to the second source select line SSL2. As another embodiment, the source select transistors of the cell strings CS11' to CS1m' and CS21' to CS2m' may be commonly connected to one source select line.

The first to nth memory cells MC1 to MCn of each cell string may be connected between the source select transistor SST and the drain select transistor DST in series. The gates of the first to nth memory cells MC1 to MCn may be connected to the first to nth word lines WL1 to WLn, respectively.

The drain select transistor DST of each cell string may be connected between a corresponding bit line and the memory cells MC1 to MCn. The drain select transistors of the cell strings arranged in the row direction may be connected to the drain select line extending in the row direction. The drain select transistors of the cell strings CS11' to CS1m' of the first row may be connected to the first drain select line DSL1. The drain select transistors of the cell strings CS21' to CS2m' of the second row may be connected to the second drain select line DSL2.

As a result, the memory block BLKb of FIG. 5 may have a circuit similar to that of the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

As an embodiment, at least one or more of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As more dummy memory cells are provided, reliability of an operation for the memory block BLKb may be improved, but a size of the memory block BLKb may increase. As less memory cells are provided, the size of the memory block BLKb may decrease, but the reliability of the operation for the memory block BLKb may be reduced.

In order to efficiently control at least one or more dummy memory cells, each of the dummy memory cells may have a required threshold voltage. Before or after an erase operation on the memory block BLKb, program operations on all or some of the dummy memory cells may be performed. When the erase operation is performed after the program operation is performed, the dummy memory cells may have the required threshold voltage by controlling a voltage applied to dummy word lines connected to the respective dummy memory cells.

Figure 6:
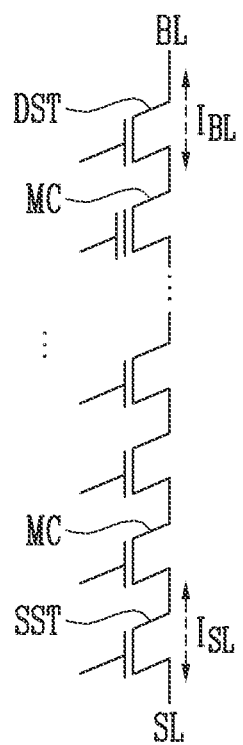
FIG. 6 is a diagram illustrating a reduction of reliability due to a threshold voltage change of select transistors according to an embodiment of the present disclosure.

FIG. 6 is a diagram illustrating a reduction of reliability due to a threshold voltage change of the select transistors according to an embodiment of the present disclosure.

Referring to FIG. 6, a cell string including a drain select transistor DST connected to a bit line BL, memory cells MCs connected in series, and a source select transistor SST connected to a source line SL is shown. The drain select transistor DST may control a current amount $I_{BL}$ between the bit line BL and the memory cells MCs, and the source select transistor SST may control a current amount $I_{SL}$ between the source line SL and the memory cells MCs. For example, when a threshold voltage of the drain select transistor DST or the source select transistor SST is lower than a normal threshold voltage, because a current amount sensed from the memory cells during a sensing operation may be lower than a normal current amount, a level higher than an actual threshold voltage of the memory cells may be sensed. Conversely, when the threshold voltage of the drain select transistor DST or the source select transistors SST is higher than the normal threshold voltage, because the current amount sensed from the memory cells during the sensing operation may be higher than the normal current amount, a level lower than the actual threshold voltage of the memory cells may be sensed, FIG. 7 is a diagram illustrating the threshold voltage change of the select transistor according to an embodiment of the present disclosure.

Figure 7:
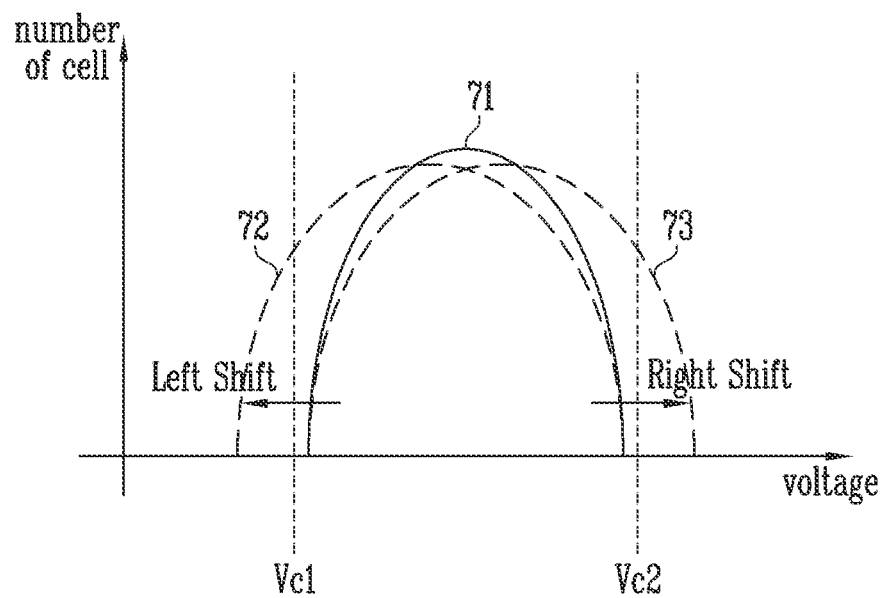
FIG. 7 is a diagram illustrating the threshold voltage change of the select transistor according to an embodiment of the present disclosure.

Referring to FIG. 7, the threshold voltages of the select transistor including the drain and source select transistors are shown. The select transistors such as the drain and source select transistors may perform a switch function of connecting or disconnecting the bit line or the source line and the cell string. In particular, in a memory device in which the memory block is implemented in a three-dimensional structure, the select transistors may be formed in the same structure as the memory cells. Therefore, in order for the select transistor to perform the switch function, the select transistor may have a normal threshold voltage 71 of a constant level.

However, the threshold voltages of the select transistor may be changed due to various reasons. Specifically, as the internal operation (for example, the read operation, the erase operation, or the program operation) of the memory block is repeated, a leakage current may be generated in the select transistors, and the threshold voltage of the select transistors may be decreased due to the generated leakage current. In addition, as the internal operation is performed on a memory cell or a cell string close to the select transistors, the threshold voltages of the select transistors may be increased due to interference of operation voltages driving the internal operation.

During the internal operation (for example, the read operation, the erase operation, or the program operation), data of the memory cells is not normally sensed due to a left shift or a right shift of decreasing or increasing, respectively, the threshold voltages of the select transistors relative to the previously formed normal threshold voltage 71, and thus reliability of the memory device may be reduced.

In an embodiment of the present disclosure, the threshold voltage of the select transistor (for example, DST or SST) may be verified, and the internal operation may be performed based on a verify result. Specifically, in order to determine whether the normal threshold voltage 71 of the select transistor has changed, each of a first threshold voltage Vc1 and a second threshold voltage Vc2 may be set as a reference voltage. The first threshold voltage Vc1 may be a voltage for checking whether the threshold voltage is decreased, and may be set as the same level as a verify target voltage of the program operation increasing the threshold voltage of the select transistor. Alternatively, the first threshold voltage Vc1 may be set as an average voltage of the lowest voltage of a normal threshold voltage distribution of the select transistor. The second threshold voltage Vc2 may be a voltage for checking whether the threshold voltage is increased, and may be set as an average voltage of the highest voltage of the normal threshold voltage distribution of the select transistor.

In addition, the memory device may perform a verify operation as to whether the threshold voltage of the select transistor has changed by comparing the threshold voltage of the select transistor with a preset reference voltage. Specifically, when the threshold voltage Vth of the select transistors is measured lower than the first threshold voltage Vc1, a change value indicating that the threshold voltage is changed may be a value of '1', and when the threshold voltage Vth of the select transistors is measured to be higher than the first threshold voltage Vc1, the change value may be a value of '0'. In addition, when the threshold voltage Vth of the select transistors is measured higher than the second threshold voltage Vc2, the change value indicating that the threshold voltage is changed may be a value of '1', and when the threshold voltage Vth of the select transistors is measured lower than the second threshold voltage Vc2, the change value may be a value of '0'. That is, when the threshold voltage Vth of the select transistors decreases or increases, the change value may be '1', and the memory device may verify the threshold voltage of the select transistor based on the change value. For example, as a result of verifying a specific select transistor, when the change value for the first threshold voltage Vc1 is '1' and the change value for the second threshold voltage Vc2 is '0', the memory device may determine that the threshold voltage Vth of a corresponding select transistor is decreased. In addition, as the result of verifying the specific select transistor, when the change value for the first threshold voltage Vc1 is '0' and the change value for the second threshold voltage Vc2 is '1', the memory device may determine that the threshold voltage Vth of the corresponding select transistor is increased. For example, as the result of verifying the specific select transistor, when the change value for the first threshold voltage Vc1 is '1' and the change value for the second threshold voltage Vc2 is '1', the memory device may determine that a distribution of the threshold voltage Vth of the corresponding select transistor is widened on the whole. For example, as the result of verifying the specific select transistor, when the change value for the first threshold voltage Vc1 is '0' and the change value for the second threshold voltage Vc2 is '0', the memory device may determine that the corresponding select transistor maintains an initial distribution of the normal threshold voltage 71.

Figure 8:
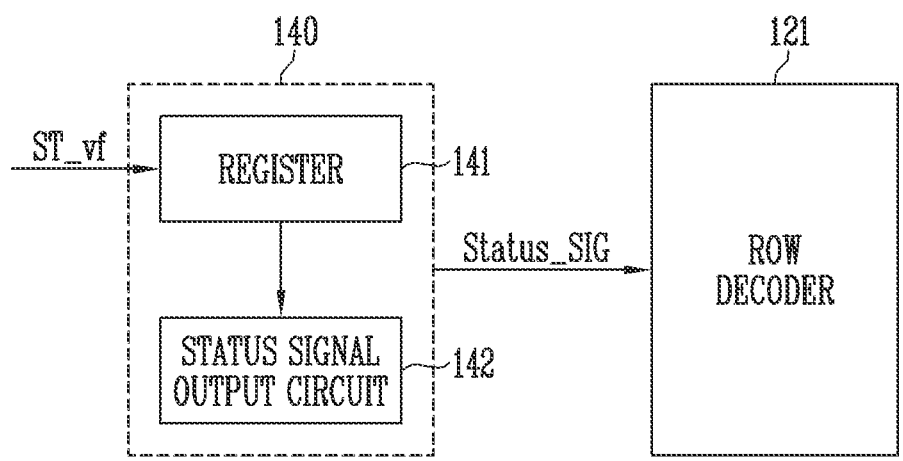
FIG. 8 is a block diagram illustrating a bad string management component according to an embodiment of the present disclosure.

FIG. 8 is a block diagram illustrating the bad string management component 140 according to an embodiment of the present disclosure.

Referring to FIG. 8, the bad string management component 140 may include a register 141 and a status signal output circuit 142. The register 141 may receive a verify result ST_vf for the threshold voltage of the select transistors and store status information of the select transistor according to the received verify result. In addition, the status signal output circuit 142 may output a status signal Status_SIG indicating a pass or a fail based on the status information stored in the register 141.

The row decoder 121 may receive the row address RADD from the control logic 139 and may receive the status signal Status_SIG from the bad string management component 140. In addition, the row decoder 121 may be controlled to perform the internal operation only on a cell string including a select transistor passed in the verification according to the row address and the status signal. Here, the internal operation may include the program operation, the read operation, and the erase operation.

Specifically, the row decoder 121 may perform a switching operation so that the block word line voltage is not applied to a cell string including a select transistor that failed in the verification, in response to the status signal. For example, the program operation and the read operation may be perform in a page unit, and the row decoder 121 may perform the switching operation so as not to generate the block word line BLKWL voltage in response to the status signal.

Figure 9:
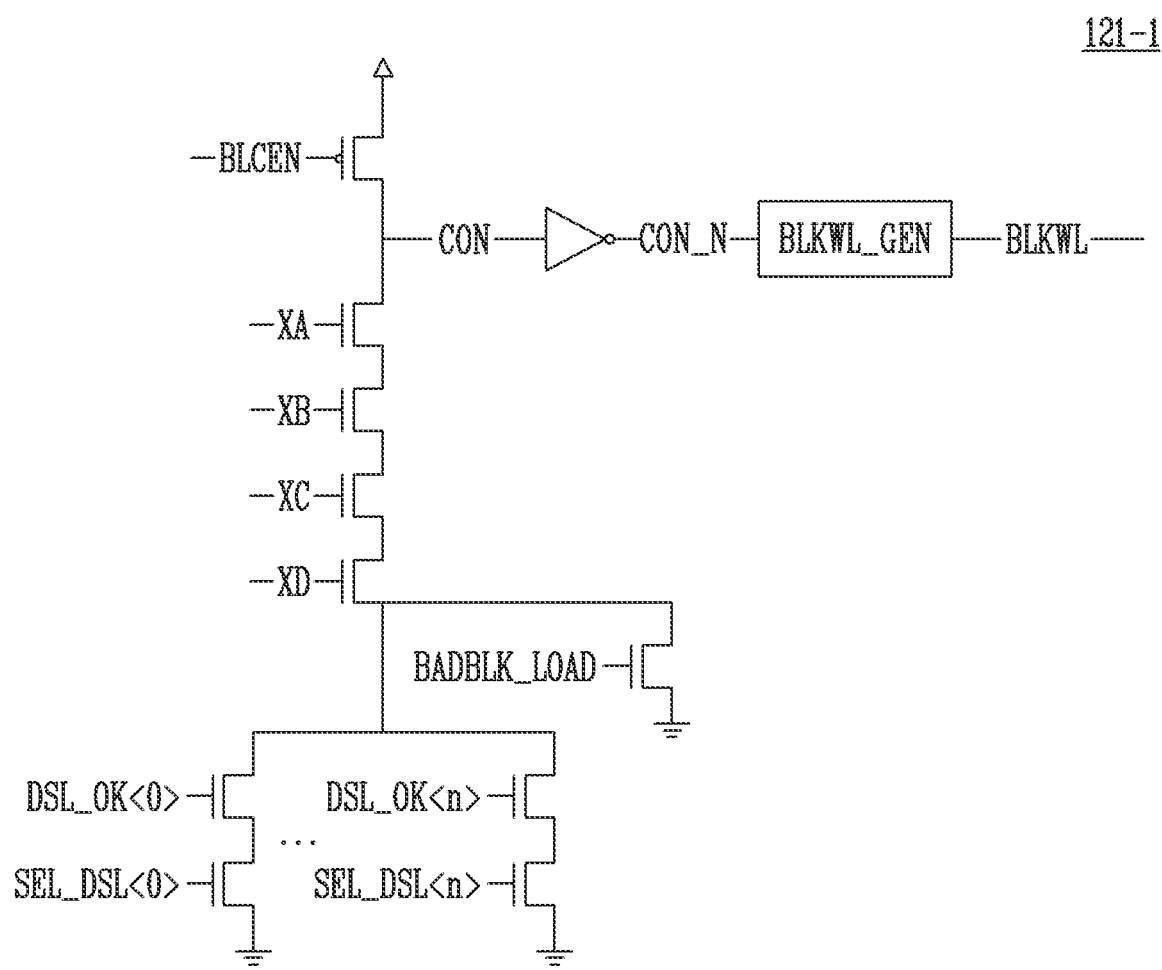
FIG. 9 is a diagram illustrating a configuration of a row decoder according to an embodiment of the present disclosure.
Figure 10:
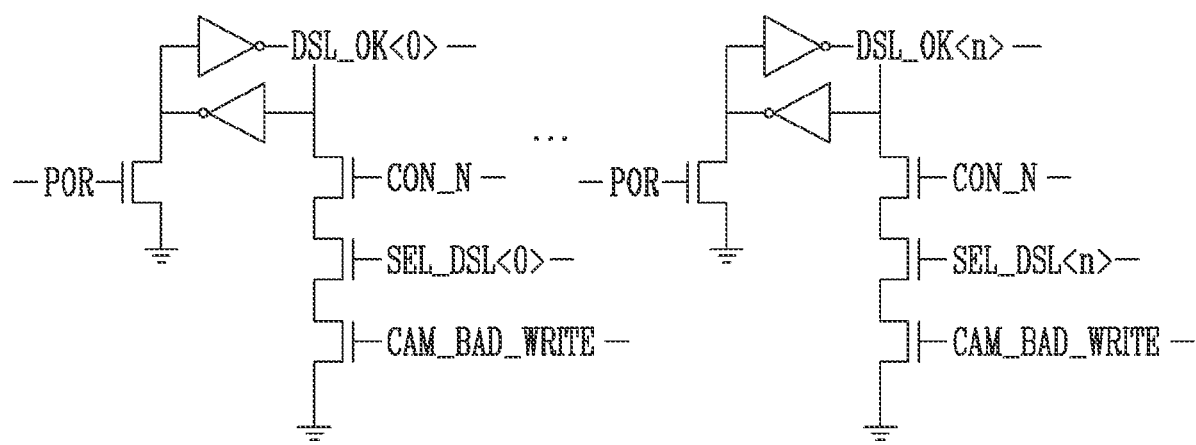
FIG. 10 is a diagram illustrating a configuration of a row decoder according to an embodiment of the present disclosure.
Figure 11:
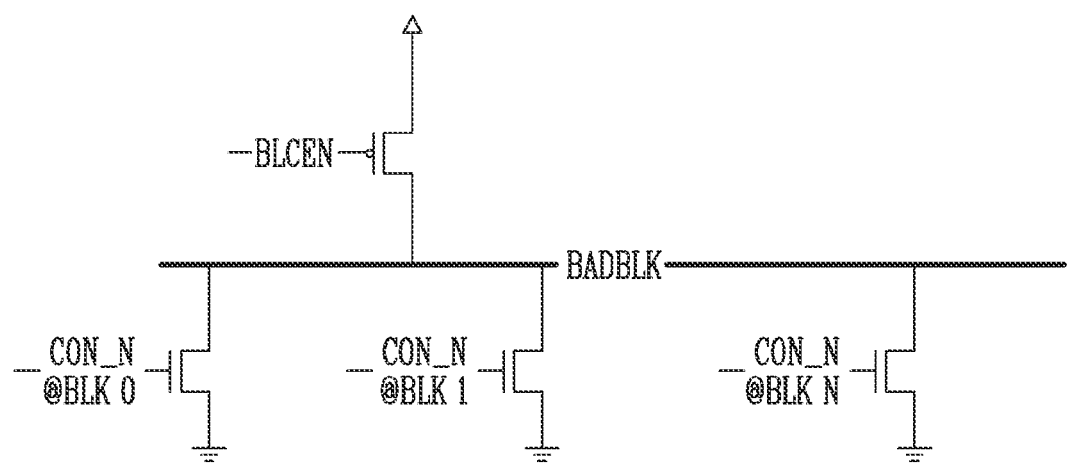
FIG. 11 is a diagram illustrating a bad block processing method according to an embodiment of the present disclosure.

FIGS. 9 and 10 are diagrams illustrating a configuration of the row decoder 121 according to an embodiment of the present disclosure. FIG. 11 is a diagram illustrating a bad block processing method according to an embodiment of the present disclosure.

Referring to FIGS. 9 and 10, a first circuit 121-1 and a second circuit 121-2, respectively, of the row decoder 121 are shown. The memory device may bad-process a fail cell string including a fail select transistor in one string unit based on the first circuit 121-1 and the second circuit 121-2.

A DSL_OK<0:n> signal may be first set to '1' when the memory device is powered-on, and after the verify operation of the select transistor, when a corresponding select line is bad-processed, the DSL_OK<0:n> signal may be set to '0'. That is, the DSL_OK<0:n> signal may be a signal indicating whether the drain select line may normally operate. Specifically, the DSL_OK<0:n> signal may be updated as a signal of '1' is generated as a CON_N signal, a SEL_DSL<x> signal, and a CAM BAD WRITE signal, when all of a BADBLK_LOAD signal, an XA signal, an XB signal, an XC signal, and an XD signal are applied as '1'. Here, the XA signal, the XB signal, the XC signal, and the XD signal may be signals applied in response to a specific address. The SEL_DSL signal may be a signal indicating that the drain select line DSL is selected in response to the specific address. The CON_N signal may be a signal indicating selection of the memory block in response to the specific address.

As an embodiment, when the internal operation is performed on a cell string in which the DSL_OK<0:n> signal is set as '0', the row decoder 121 may perform the switching operation differently according to a case where the internal operation is operated in one string unit and a case where the internal operation is operated in a multi-string unit. Specifically, when the internal operation is operated in one string unit, for example, when the internal operation is the program operation or the read operation, the row decoder 121 may receive '1' as the SEL_DSL<x> signal corresponding to the drain select line according to the specific address. However, when the specific address is a cell string including the fail select transistor, the DSL_OK<x> signal may be set as '0', '1' may be generated as the SEL_DSL<x> signal, and thus the block word line BLKWL voltage may not be generated. In this case, a voltage of a global word line Global WL may not be transferred to a local word line Local WL, and the program operation or the read operation may not be performed. Referring to FIG. 11, when even one block among the memory blocks is not decoded, '1' as a BADBLK signal may be transferred to the control logic, and thus an internal operation state may be generated as a fail.

On the other hand, when the internal operation is operated in the multi-string unit, for example, when the internal operation is the erase operation in which the memory block is used as one operation unit, the row decoder 121 may perform the internal operation regardless of whether a bad cell string including the fail select transistor exists. Specifically, the erasing operation may include an erase pulse period and an erase verify period. During the erase pulse period, the row decoder 121 may apply the same voltage to all the drain select lines DSL included in the memory block. Specifically, the row decoder 121 may be controlled so that all SEL_DSL<0:n> signals are generated as '1', so that all the drain select lines may be selected. When even one of the DSL_OK<0:n> signals is '1', that is, when even one of the drain select lines normally operates, the row decoder 121 may perform the switching operation so that the block word line BLKWL voltage is generated. In the erase verify period, the row decoder 121 may be controlled to sequentially perform the erase verification on all cell strings for each cell string. When the erase verification is performed for each cell string, when a specific string is processed as a bad string, a sensing operation may be performed while the block word line BLKWL is disabled (CON_N='0').

Figure 12:
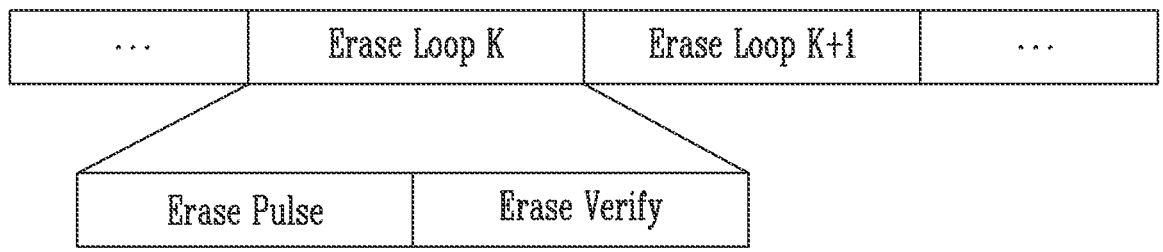
FIG. 12 is a diagram illustrating an erase operation according to an embodiment of the present disclosure.

FIG. 12 is a diagram illustrating the erase operation according to an embodiment of the present disclosure.

Referring to FIG. 12, an erase loop may include an erase puke period and an erase verify period.

The erase puke period may be a period in which the erase voltage is applied to the memory block. Specifically, when the erase voltage is applied to the memory cells included in the memory block, a charge trapped in a floating gate may move and the threshold voltage of the memory cell may be changed. That is, the erase pulse period may be a period for making the memory cells included in the memory block into an erase state in which the memory cells are not programmed.

The erase verify period may be a period in which, it is verified whether the threshold voltage of the memory cells included in the memory block reaches the erase state that is a target state after the erase pulse period. The erase verify period may include a period for sensing the bit line. In the erase verify period, the sensing circuit 126 may generate the reference current in response to the permission bit signal VRYBIT, and compare the sensing voltage VPB received from the page buffer group 123 with the reference voltage generated by the reference current to output the pass signal PASS or the fail signal FAIL.

Conventionally, when the distribution of the threshold voltage of the select transistor included in the memory block is abnormally formed, the memory block including a corresponding select transistor may be identified as a bad block. In addition, when the internal operation, for example, the erase operation, for the bad block is performed, the block word line voltage for the bad block is not generated, and thus the erase voltage is not applied to a cell string including a normal select transistor.

According to an embodiment of the present disclosure, even though a plurality of select transistors of which the distribution of the threshold voltage is abnormally formed exist in the memory block, the block word line voltage may be generated when at least one normal select transistor exists, and thus the erase voltage may be applied to the memory block. In addition, in the erase verify period, the memory device may sequentially perform the erase verification on the plurality of cell strings, and may determine a pass or a fail for each cell string.

Figure 13:
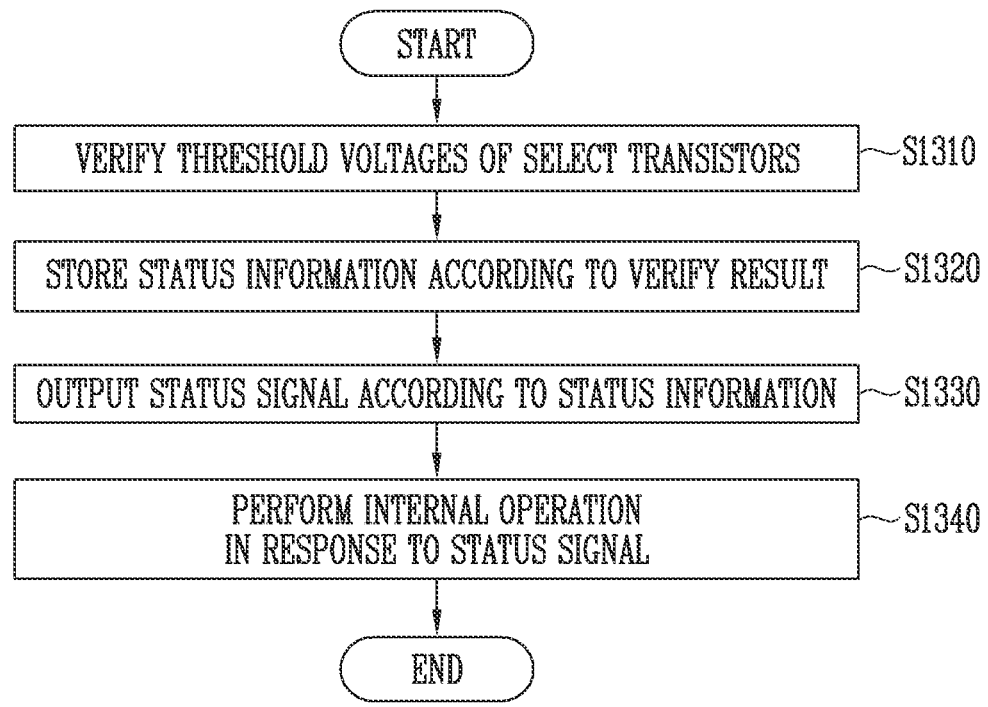
FIG. 13 is a flowchart illustrating a method of operating a memory device according to an embodiment of the present disclosure.

FIG. 13 is a flowchart illustrating a method of operating a memory device, such as the memory device 100, according to an embodiment of the present disclosure.

The memory device may verify the threshold voltages of the select transistor (S1310). When the internal operation of the memory block is repeated several times, a leakage current may be generated in the select transistors, and the threshold voltage of the select transistors may be decreased due to the generated leakage current. Alternatively, the threshold voltage of the select transistors may be increased due to interference of the operation voltages for the internal operation. The memory device may verify whether the threshold voltage of the select transistor has shifted (see FIG. 7) to the left (Left Shift) in which the threshold voltage of the select transistors is lower than the previously formed normal threshold voltage or has shifted to the right (Right Shift) in which the threshold voltage of the select transistors is higher than the normal threshold voltage. The memory device may use the first threshold voltage Vc1 and the second threshold voltage Vc2 as the reference voltage to determine whether the threshold voltage of the select transistor is changed.

In addition, the memory device may store the status information according to the verify result (S1320). Specifically, when the threshold voltage of the select transistor has changed, the memory device may store the status information of the select transistor as a fail, and when the threshold voltage of the select transistor is not changed, the memory device may store the status information of the select transistor as a pass.

In addition, the memory device may output the status signal according to the status information (S1330). Specifically, the memory device may output the status signal indicating whether the verification of the threshold voltage has passed or failed based on the stored status information.

In addition, the memory device may perform the internal operation in response to the status signal (S1340). Here, the internal operation may include the program operation, the read operation, or the erase operation. As an embodiment, during the program operation or the read operation, the memory device may perform the switching operation so that the block word line voltage is not applied to the cell string including the fail select transistor. As an embodiment, even in a case where the fail select transistor is included in the memory block, the memory device may apply the erase voltage to a cell string including the remaining pass select transistors. Specifically, the memory device may generate the select line selection signal with respect to all cell strings included in the memory block and apply the same erase voltage to the select line corresponding to all the cell strings. In addition, the memory device may sequentially perform the erase verification on all the cell strings included in the memory block for each cell string, and store the result of the erase verification in the page buffer connected to the bit line.

Figure 14:
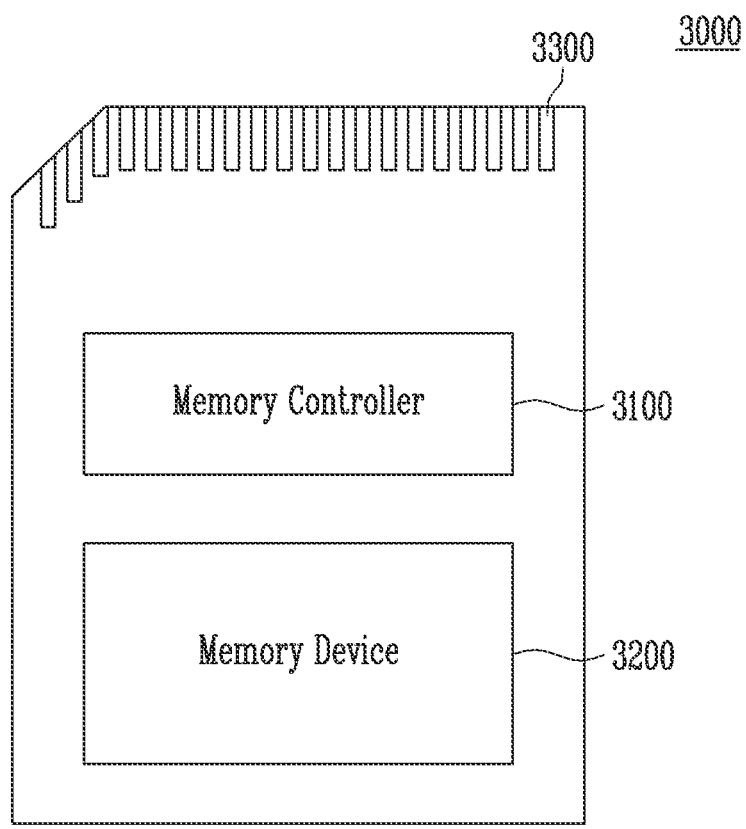
FIG. 14 is a diagram illustrating a memory card system according to an embodiment of the present disclosure.

FIG. 14 is a diagram illustrating a memory card system 3000 according to an embodiment of the present disclosure.

Referring to FIG. 14, the memory card system 3000 may include a memory controller 3100, a memory device 3200, and a connector 3300.

The memory controller 3100 may be electrically connected to the memory device 3200, and the memory controller 3100 may be configured to access the memory device 3200. For example, the memory controller 3100 may be configured to control a read operation, a write operation, an erase operation, and a background operation for the memory device 3200. The memory controller 3100 may be configured to provide an interface between the memory device 3200 and a host. In addition, the memory controller 3100 may drive firmware for controlling the memory device 3200.

For example, the memory controller 3100 may include components such as random access memory (RAM), a processor, a host interface, a memory interface, and an error correction circuit.

The memory controller 3100 may communicate with an external device through the connector 3300. The memory controller 3100 may communicate with an external device (for example, the host) according to a specific communication standard. For example, the memory controller 3100 may be configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards described above.

For example, the memory device 3200 may be implemented using various non-volatile memory elements such as electrically erasable and programmable ROM (EEPROM), NAND flash memory, NOR flash memory, phase-change RAM (PRAM), resistive RAM (ReRAM), ferroelectric RAM (FRAM), and spin-transfer magnetic RAM (STT-MRAM).

The memory controller 3100 and the memory device 3200 may be integrated into one semiconductor device to configure a memory card. For example, the memory controller 3100 and the memory device 3200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCrnicro, or eMMC), an SD card (SD, miniSD, microSD, or SDHC), and a universal flash storage (UFS).

Figure 15:
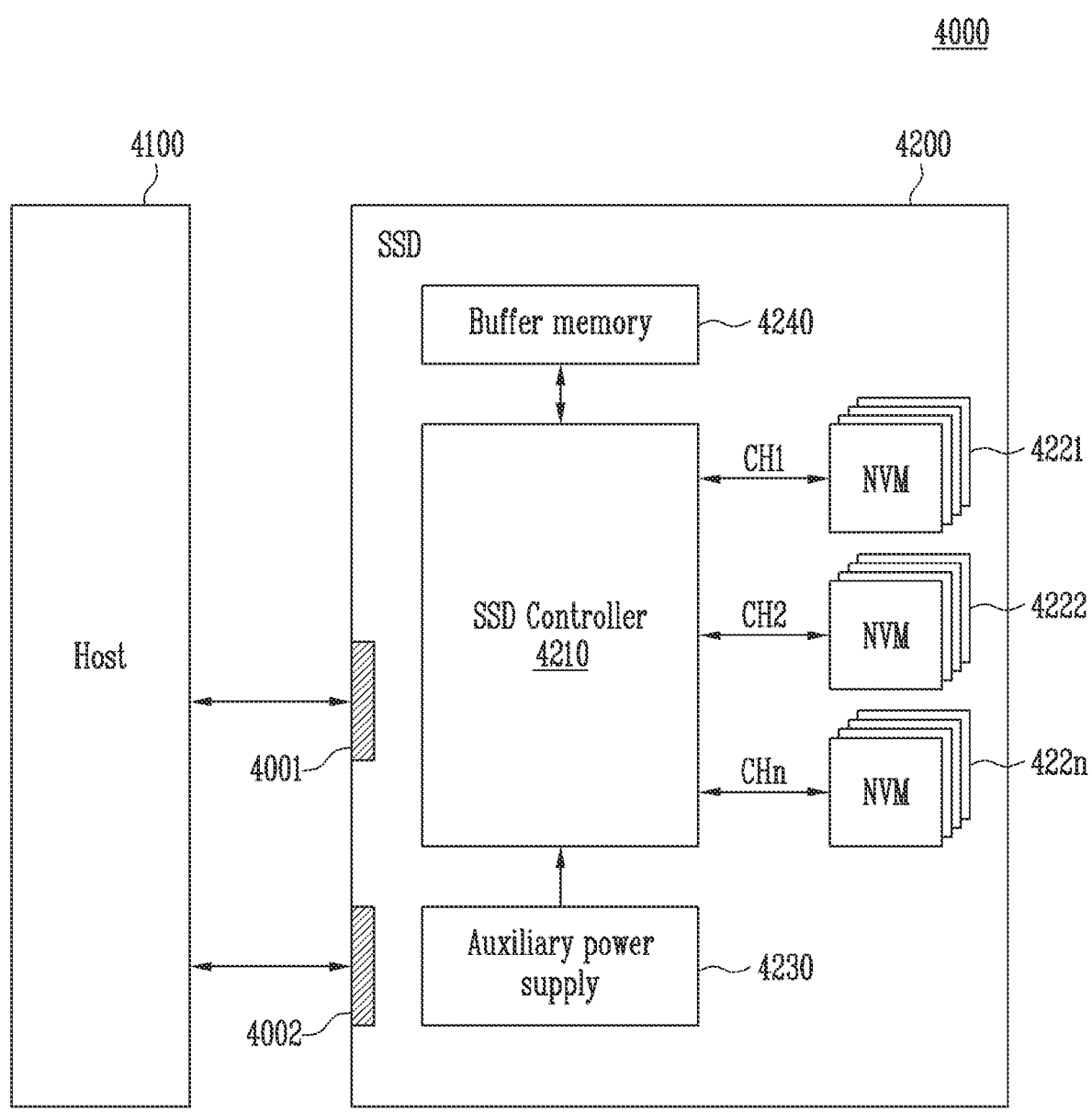
FIG. 15 is a diagram illustrating a solid state drive (SSD) system according to an embodiment of the present disclosure.

FIG. 15 is a diagram illustrating a solid state drive (SSD) system 4000 according to an embodiment of the present disclosure.

Referring to FIG. 15, the SSD system 4000 may include a host 4100 and an SSD 4200. The SSD 4200 may exchange a signal SIG with the host 4100 through a signal connector 4001 and receive power PWR through a power connector 4002. The SSD 4200 may include an SSD controller 4210, a plurality of flash memories 4221 to 422n, an auxiliary power device 4230, and buffer memory 4240.

In an embodiment, the SSD controller 4210 may perform a function of the memory controller 200 described with reference to FIG. 1. The SSD controller 4210 may control the plurality of flash memories 4221 to 422n in response to the signal SIG received from the host 4100. For example, the signal SIG nay be a signal based on an interface between the host 4100 and the SSD 4200. For example, the signal SIG may be a signal defined by at least one interface such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 4230 may be connected to the host 4100 through the power connector 4002. The auxiliary power device 4230 may receive the power PWR from the host 4100 and may charge the power. The auxiliary power device 4230 may provide power of the SSD 4200 when power supply from the host 4100 is not smooth. For example, the auxiliary power device 4230 may be positioned in the SSD 4200 or may be positioned outside the SSD 4200. For example, the auxiliary power device 4230 may be positioned on a main board and may provide auxiliary power to the SSD 4200.

The buffer memory 4240 operates as a buffer memory of the SSD 4200. For example, the buffer memory 4240 may temporarily store data received from the host 4100 or data received from the plurality of flash memories 4221 to 422n, or may temporarily store metadata (for example, a mapping table) of the flash memories 4221 to 422n. The buffer memory 4240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 16:
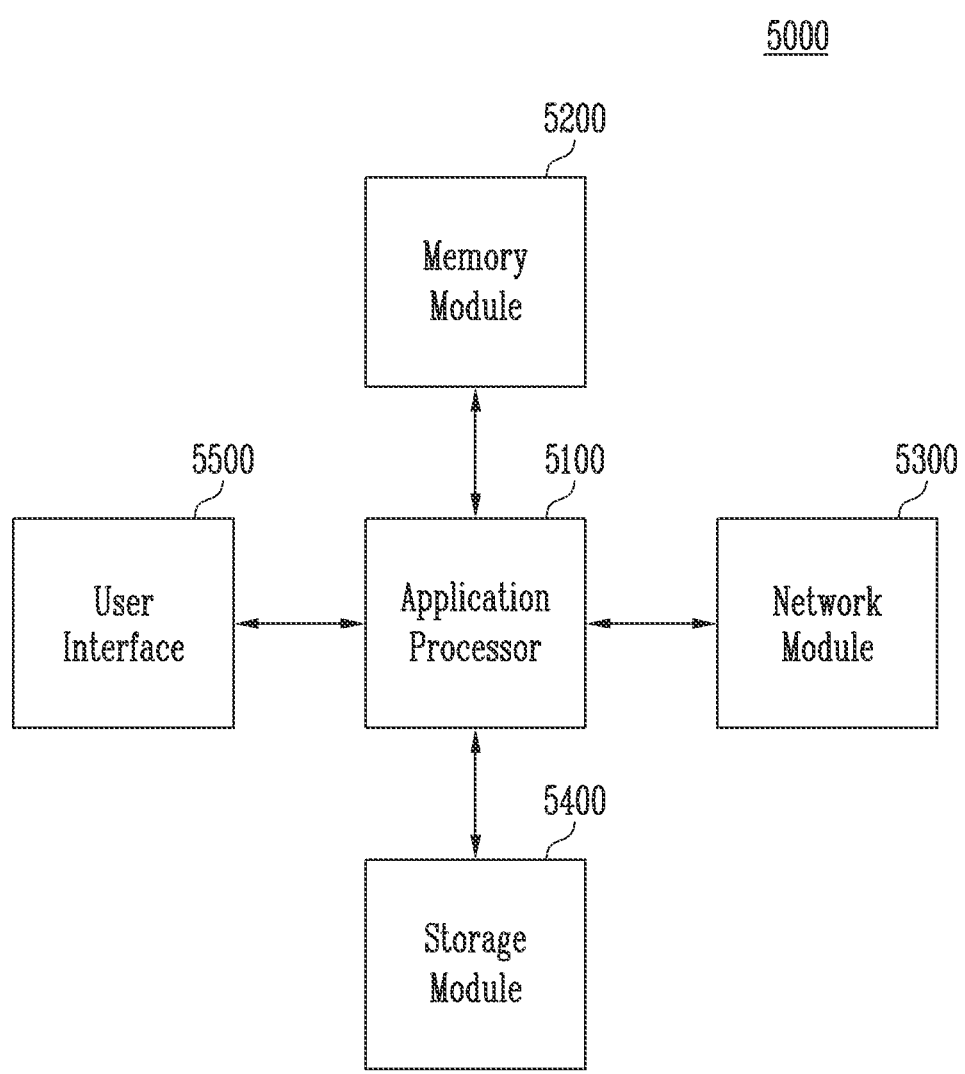
FIG. 16 is a diagram illustrating a user system according to an embodiment of the present disclosure.

FIG. 16 is a diagram illustrating a user system 5000 according to an embodiment of the present disclosure.

Referring to FIG. 16, the user system 5000 may include an application processor 5100, a memory module 5200, a network module 5300, a storage module 5400, and a user interface 5500.

The application processor 5100 may drive components, an operating system (OS), a user program, or the like included in the user system 5000. For example, the application processor 5100 may include controllers, interfaces, graphics engines, and the like that control the components included in the user system 5000. The application processor 5100 may be provided as a system-on-chip (SoC).

The memory module 5200 may operate as a main memory, an operation memory, a buffer memory, or a cache memory of the user system 5000. The memory module 5200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 5100 and memory module 5200 may be packaged based on a package on package (POP) and provided as one semiconductor package.

The network module 5300 may communicate with external devices. For example, the network module 5300 may support wireless communication protocols such as code division multiple access (CDMA), global system for mobile communications (GSM), wideband CDMA (WCDMA), CDMA-2000, time division multiple access (TDMA), long term evolution, Wimax, MILAN, UWB, Bluetooth, and WI-FI. For example, the network module 5300 may be included in the application processor 5100.

The storage module 5400 may store data. For example, the storage module 5400 may store data received from the application processor 5100. Alternatively, the storage module 5400 may transmit data stored in the storage module 5400 to the application processor 5100. For example, the storage module 5400 may be implemented as a non-volatile semiconductor memory element using memory such as phase-change RAM (PRAM), magnetic RAM (MRAM), resistive RAM (RRAM), NAND flash, NOR flash, and three-dimensional NAND flash. For example, the storage module 5400 may be provided as a removable storage device (removable drive), such as a memory card, and an external drive of the user system 5000.

For example, the storage module 5400 may include a plurality of non-volatile memory devices, and the plurality of non-volatile memory devices may operate identically to the memory device described with reference to FIGS. 1 to 13. The storage module 5400 may operate identically to the storage device 1000 described with reference to FIG. 1.

The user interface 5500 may include interfaces for inputting data or an instruction to the application processor 5100 or for outputting data to an external device. For example, the user interface 5500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 5500 may include user output interfaces such as a liquid crystal display (LCD), an organic light emitting diode (OLED) display device, an active matrix OLED (AMOLED) display device, an LED, a speaker, and a monitor.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A memory device comprising:
   a plurality of cell strings each including a select transistor and memory cells connected in series;
   a peripheral circuit configured to apply a verify voltage to the select transistor and perform an internal operation on the memory cells; and
   control logic configured to control the peripheral circuit to apply an operation voltage for the internal operation, wherein the control logic comprises a bad string management component configured to:
   verify threshold voltages of the select transistor;
   control the peripheral circuit to perform the internal operation on a cell string including a select transistor passed in verification according to a verify result of the select transistor, and
   control the peripheral circuit to perform a switching operation on the cell string including the select transistor failed in the verification according to thee verify result of the select transistor.

2. The memory device of claim 1, wherein the bad string management component comprises:
   a register configured to store status information of the select transistor according to the verify result; and
   a status signal output circuit configured to output a status signal including a first status signal indicating a pass status of the select transistor and a second status signal indicating a fail status of the select transistor according to the status information.

3. The memory device of claim 2, wherein the peripheral circuit is configured to perform the switching operation so that a block word line voltage is not applied to the cell string corresponding to the second status signal in response to the status signal, during a program operation or a read operation.

4. The memory device of claim 1, further comprising:
   a memory block including one or more cell strings including select transistors failed in the verification,
   wherein the control logic is configured to control the peripheral circuit to perform an erase operation on remaining cell strings of the plurality of cell strings except for the one or more cell strings when performing the erase operation using the memory block as one operation unit.

5. The memory device of claim 4, wherein the control logic is configured to control the peripheral circuit to generate a block word line voltage corresponding to the memory block when at least one select transistor passed in the verification is present among the select transistors included in the memory block.

6. The memory device of claim 4, wherein:
   the erase operation includes an erase voltage apply period and an erase verify period; and
   the control logic is configured to:
   control the peripheral circuit to generate a select line selection signal with respect to all cell strings included in the memory block during the erase voltage apply period; and
   to apply the same voltage to a select line corresponding to all the cell strings.

7. The memory device of claim 6, wherein the control logic is configured to control the peripheral circuit to sequentially perform erase verification on all the cell strings included in the memory block for each cell string in the erase verify period and store a result of the erase verification in a page buffer connected to a bit line.

8. The memory device of claim 7, wherein the control logic is configured to:
   count the number of memory cells failed in the erase verification; and
   output a trigger signal to additionally apply an erase voltage when the number of failed memory cells exceeds a preset number.

9. The memory device of claim 1, wherein the control logic is configured to compare the threshold voltages of the select transistor with a preset reference voltage to verify whether the threshold voltages of the select transistor have changed.

10. A method of operating a memory device, the method comprising:
    verifying threshold voltages of a select transistor;
    storing status information according to a verify result for the threshold voltages of the select transistor;
    outputting a status signal including a first status signal indicating a pass status of the select transistor and a second status signal indicating a fail status of the select transistor according to the status information;
    performing an internal operation in response to the status signal, and
    performing a switching operation on a cell string including the select transistor failed in verification according to the verify result of the select transistor.

11. The method of claim 10, wherein performing the internal operation comprises performing the switching operation so that a block word line voltage is not applied to the cell string corresponding to the second status signal during a program operation or a read operation.

12. The method of claim 10, wherein performing the internal operation comprises applying an erase voltage to remaining cell strings of a plurality of cell strings except for one or more cell strings when an erase operation is performed on a memory block including the plurality of cell strings including the one or more cell strings including a select transistor failed in verification.

13. The method of claim 12, wherein performing the internal operation comprises:
    generating a select line selection signal with respect to the plurality of cell strings included in the memory block; and
    applying the same erase voltage to a select line corresponding to the plurality of cell strings.

14. The method of claim 12, further comprising:
    sequentially performing erase verification on the plurality of cell strings included in the memory block for each cell string; and
    storing a result of the erase verification in a page buffer connected to a bit line.

15. The method of claim 14, further comprising:
  counting the number of memory cells failed in the erase verification; and
  outputting a trigger signal to additionally apply the erase voltage when the number of failed memory cells exceeds a preset number.

16. The method of claim 10, wherein verifying the threshold voltages comprises comparing the threshold voltages of the select transistors with a preset reference voltage to verify whether the threshold voltages of the select transistors have changed.

\* \* \* \* \*